US008368231B2

(12) United States Patent
Lee et al.

(10) Patent No.: US 8,368,231 B2
(45) Date of Patent: Feb. 5, 2013

(54) CHIPSTACK PACKAGE AND MANUFACTURING METHOD THEREOF

(75) Inventors: Kang-Wook Lee, Suwon-si (KR);
Gu-Sung Kim, Seongnam-si (KR);
Dong-Hyeon Jang, Suwon-si (KR);
Seung-Duk Baek, Asan-si (KR);
Jae-Sik Chung, Asan-si (KR)

(73) Assignee: Samsung Electronics Co., Ltd.,
Samsung-ro, Yeongtong-gu, Suwon-si,
Gyeonggi-do (KR)

( * ) Notice: Subject to any disclaimer, the term of this patent is extended or adjusted under 35 U.S.C. 154(b) by 0 days.

(21) Appl. No.: 13/154,165

(22) Filed: Jun. 6, 2011

(65) Prior Publication Data

US 2011/0237004 A1    Sep. 29, 2011

Related U.S. Application Data

(60) Continuation of application No. 12/385,855, filed on Apr. 22, 2009, now Pat. No. 7,977,156, which is a continuation of application No. 11/899,400, filed on Aug. 13, 2007, now Pat. No. 7,537,959, which is a division of application No. 10/890,995, filed on Jul. 15, 2004, now Pat. No. 7,276,799.

(30) Foreign Application Priority Data

Aug. 26, 2003  (KR) .............................. 2003-59166

(51) Int. Cl.
*H01L 23/48* (2006.01)

(52) U.S. Cl. ........ 257/777; 257/678; 257/298; 257/774; 257/778; 257/780

(58) Field of Classification Search .................. 257/678, 257/698, 778, 780, 781, 777
See application file for complete search history.

(56) References Cited

U.S. PATENT DOCUMENTS

| 5,032,896 A | 7/1991 | Little et al. |
| 5,059,899 A | 10/1991 | Farnworth et al. |
| 5,688,721 A | 11/1997 | Johnson |
| 5,883,430 A | 3/1999 | Johnson |
| 5,998,292 A | 12/1999 | Black et al. |

(Continued)

FOREIGN PATENT DOCUMENTS

| JP | 10-223833 | 8/1998 |
| JP | 2001-053218 | 2/2001 |

(Continued)

OTHER PUBLICATIONS

Korean Office Action dated Jun. 29, 2005, for corresponding Korean Application No. 10-2003-0059166.

(Continued)

*Primary Examiner* — Long Tran
(74) *Attorney, Agent, or Firm* — Muir Patent Consulting, PLLC

(57) ABSTRACT

A method for manufacturing chip stack packages may include: providing at least two wafers, each wafer having a plurality of chips, and scribe lanes formed between and separating adjacent chips; forming a plurality of via holes in peripheral portions of the scribe lanes; forming connection vias by filling the via holes; establishing electrical connections between the chip pads and corresponding connection vias; removing material from the back sides of the wafers to form thinned wafers; separating the thinned wafers into individual chips by removing a central portion of each scribe lane; attaching a first plurality of individual chips to a test wafer; attaching a second plurality of individual chips to the first plurality of individual chips to form a plurality of chip stack structures; encapsulating the plurality of chip stack structures; and separating the plurality of chip stack structures to form individual chip stack packages.

19 Claims, 11 Drawing Sheets

U.S. PATENT DOCUMENTS

| | | | |
|---|---|---|---|
| 6,064,114 | A | 5/2000 | Higgins, III |
| 6,175,160 | B1 | 1/2001 | Paniccia et al. |
| 6,235,554 | B1 | 5/2001 | Akram et al. |
| 6,391,685 | B1 | 5/2002 | Hikita et al. |
| 6,429,509 | B1 | 8/2002 | Hsuan |
| 6,476,476 | B1 * | 11/2002 | Glenn .......................... 257/686 |
| 6,734,084 | B1 | 5/2004 | Nemoto et al. |
| 6,766,998 | B2 | 7/2004 | Silverbrook |
| 6,908,784 | B1 | 6/2005 | Farnworth et al. |
| 7,074,703 | B2 | 7/2006 | Fukazawa |
| 7,537,959 | B2 | 5/2009 | Lee et al. |
| 2002/0025603 | A1 | 2/2002 | Ondricek et al. |
| 2002/0074668 | A1 | 6/2002 | Hofstee et al. |
| 2004/0018667 | A1 | 1/2004 | Joshi et al. |
| 2004/0135231 | A1 | 7/2004 | Keller et al. |
| 2005/0019965 | A1 | 1/2005 | Chao et al. |
| 2005/0051883 | A1 | 3/2005 | Fukazawa |
| 2005/0161794 | A1 | 7/2005 | Kato et al. |
| 2005/0269684 | A1 | 12/2005 | Baek et al. |
| 2007/0023887 | A1 | 2/2007 | Matsui |
| 2008/0128883 | A1 | 6/2008 | Lee et al. |

FOREIGN PATENT DOCUMENTS

| | | |
|---|---|---|
| JP | 2001-093869 | 4/2001 |
| JP | 2001-210782 | 8/2001 |
| JP | 2001-223469 | 8/2001 |
| JP | 2002-016212 | 1/2002 |
| JP | 2002-110897 | 4/2002 |
| JP | 2002-170904 | 6/2002 |
| JP | 2003-163326 | 6/2003 |
| JP | 2004-071838 | 3/2004 |
| JP | 2005-026582 | 1/2005 |
| KR | 10-2000-0067291 | 11/2000 |
| KR | 10-2001-0001159 | 1/2001 |
| KR | 10-2001-0018694 | 3/2001 |
| KR | 2002-0012061 | 2/2002 |
| KR | 10-2003-0023040 | 3/2003 |
| KR | 2005-0074793 | 7/2005 |

OTHER PUBLICATIONS

Office Action dated Apr. 13, 2010, issued in corresponding Japanese Application No. 2004-242970.

* cited by examiner

CHIPSTACK PACKAGE AND MANUFACTURING METHOD THEREOF

CROSS REFERENCE TO RELATED APPLICATIONS

This application claims priority from and is a Continuation of U.S. patent application Ser. No. 12/385,855, filed on Apr. 22, 2009 now U.S. Pat. No. 7,977,156, which is a Continuation of U.S. patent application Ser. No. 11/889,400, filed on Aug. 13, 2007 (now U.S. Pat. No. 7,537,959), which is a divisional of U.S. patent application Ser. No. 10/890,995, filed on Jul. 15, 2004 (now U.S. Pat. No. 7,276,799) the entire contents of all of which are incorporated herein by reference.

BACKGROUND

1. Field

The present invention relates generally to electronic packaging technology and, more particularly, to a three-dimensional multi-chip stack package and a method for manufacturing such chip stack packages.

2. Description of the Related Art

With the rapid advancement of very large scale integrated circuit (VLSI) technologies, traditional packaging is becoming a performance bottleneck of the advanced microelectronics devices. This is due to the rapidly increasing of pin count and clock speed on the advanced devices. Along with the fast clock speed, power distribution of the advanced devices also is an important issue that must be addressed. Furthermore, the chip size of the advanced devices continues to grow although sub-micron processing technologies continue to reduce the minimum feature sizes on the devices. Multi-chip packaging technology is a packaging technique that has been developed to address some of the problems associated with conventional single-chip packaging.

A three-dimensional chip stack packaging has been introduced as part of the multi-chip packaging. FIG. 1 illustrates a conventional chip stack package 500 that includes two chips 511, 513 stacked on a common substrate 520. Specifically, a lower chip 511 is attached through an adhesive layer 531 on the substrate 520 so that an active surface, on which chip pads 512 are formed, faces away from the substrate (upward). An upper chip 513, which includes an active surface having chip pads 514, is attached to the active surface of the lower chip 511 using an adhesive layer 533 so that chip pads 514 face upward. Bonding wires 541, 543 are then used to form electrical connection between the chip pads 512, 514 of the chips 511, 513 and the substrate 520. An encapsulating body 550 is then formed to surround and protect the chips 511 and 513, the wires 541 and 543, and at least a portion of the top surface of the substrate 520 from the environment. A series of solder balls 560 are formed on a bottom surface of the substrate 520 to provide external electrical connections for the chips 511, 513.

Relative to single chip packaging, however, such conventional multi-chip stack packaging methods, however, tend to incur increased manufacturing time and cost associated with stacking the individual chips. In order to avoid these issues, wafer-level chip stacking has been considered to be an option for three-dimensional packaging. The ability to stack and connect multiple chips, before separating the individual chips from their parent wafers, offers several benefits over conventional chip stacking techniques including reduced manufacturing time and reduced cost FIG. 2 illustrates a conventional wafer-level chip stack package. As illustrated in FIG. 2, at least one overlying wafer 610 and a single bottom wafer 610a, each of which may be composed of hundreds or thousands of undivided chips, are stacked together using intermediate films 630, typically a kind of anisotropic conductive film (ACF). Before stacking, each of the wafers 610, 610a is covered with a passivation layer 613 and an insulating layer 614 that protect the chip circuitry (not shown) while exposing the chip pads 612. Metal vias 617 are formed through the overlying wafers 610, starting from an upper surface of the insulating layer 614 and extending to a lower surface of the wafers. Metal traces 615 connect the chip pads 612 to a top end of the corresponding metal vias 617. The intermediate film 630 provides a connection between the bottom end of the metal vias 617 and the corresponding metal trace 615 arranged on the next lower overlying wafer 610 or the bottom wafer 610a.

Unfortunately, wafer-level chip stacking processes as illustrated in FIG. 2 tend to suffer increased yield losses because a defective chip located on any of the included wafers 610, 610a will cause the chip-stack within which the defective chip is incorporated to fail. The failures caused by a single defective chip result in the lost of all of the properly functioning chips incorporated into the same chip stack. The number of properly functioning chips that will be lost, as well as the risk of incorporating a defective chip in a particular chip stack, increases with the number of wafers being stacked.

SUMMARY

The exemplary embodiments of the present invention provide a variety of chip stack packages and methods for manufacturing such chip stack packages that are intended to reduce manufacturing time, manufacturing cost, and yield loss.

In an exemplary embodiment of the present invention, a three-dimensional chip stack package comprises a common substrate, first and second chips, and a plurality of connection terminals. The substrate includes a first surface and a second surface. The first chip has parts of scribe lanes remaining after wafer sawing, and a plurality of first connection vias formed in the remaining parts of the scribe lanes and connecting upper and lower surfaces of the chip. The first chip is disposed on and electrically connected to the first surface of the substrate through the first connection vias. The second chip has parts of scribe lanes remaining after wafer sawing, and a plurality of second connection vias formed in the remaining parts of the scribe lanes and connecting upper and lower surfaces of the second chip. The second chip is disposed on and electrically connected to the upper surface of the first chip through the second connection vias. The connection terminals are disposed on the second surface of the substrate and electrically connected to the first connection vias of the first chip.

In the chip stack package according to the invention, the substrate on which the first and second chips are mounted may be a test wafer provided and configured for conducting wafer-level testing. Preferably, the first and second chips are known-good dies that have passed required wafer-level tests. Each chip may also include a plurality of chip pads formed on the active or upper surface thereof and a plurality of rerouting lines connecting the chip pads to corresponding connection vias.

The chip stack package may further comprise a plurality of first connection bumps provided between the substrate and the first chip and joined to the first connection vias, and a plurality of second connection bumps provided between the first and the second chips and joined to the first and second connection vias. The substrate and the first connection vias may also be directly joined and/or the first and second connection vias may be directly joined.

If utilized, the first and second connection bumps may be micro metal bumps, preferably having a diameter of about 20-60 μm. Furthermore, the lower surface of each chip may be, and typically is, formed by removing a majority the wafer thickness from the backside surface of the parent wafer. Preferably, the thickness of each chip is no more than about 50 μm. Further, each of the first and the second connection vias may be surrounded with an insulating layer. The first and second chips may have identical chip sizing and function, such as identical memory chips, or may have different chip sizing and/or chip function, such as a logic chip and a memory chip.

An exemplary method according to the present invention provides a method for manufacturing such three-dimensional chip stack packages comprising providing at least two wafers each having a plurality of chips and scribe lanes between the adjacent chips; forming a plurality of via holes in both peripheral parts of each scribe lane; forming a plurality of connection vias by filling the via holes with metal; electrically connecting the connection vias to the chips; and partially removing the parent wafer material from a backside surface to expose lower surfaces of the connection vias are exposed on the backside surface. The exemplary method further comprises sawing the wafers along a central part of each scribe lane so that the individual chips are separated from each other while maintaining a peripheral part of each scribe lane with each of the separated chips; attaching the first separated chips to a test wafer so that the connection vias are electrically connected to the test wafer, and then performing wafer-level testing; attaching second separated chips on the first chips so that the connection vias of the second chips are electrically connected to the connection vias of the first chips, and then performing wafer-level testing; encapsulating the at least two-layered chips with a resin encapsulant; and separating individual chip stack packages by sawing the test wafer.

In the exemplary method, the via holes are preferably formed in the scribe lines through a laser drilling process. After forming the initial via hole, additional via processing may include forming an insulating layer on the inner wall of each via hole, forming a barrier metal on the insulating layer, and forming a seed metal on the barrier metal. Also, attaching the first chips to the test wafer may include providing first connection bumps on the test wafer, thermally joining the first connection bumps to the test wafer. Similarly, attaching the second chips may include providing second connection bumps on the first chips and thermally joining the second connection bumps to the first chips. If both first and second connection bumps are utilized, it is preferred that the first connection bumps be formed from a material exhibiting a higher melting point than that of the material used to form the second connection bumps.

Further, the step of sawing the wafers is preferably accomplished using a laser cutter with the electrical connections between the connection vias and the chips preferably being accomplished through a rerouting technique. Further, the step of removing a partial thickness of the parent wafer from the wafer backside is preferably accomplished by a spin-wet etching technique that may be used to reduce the thickness of the wafer to about 50 μm or less and may include forming a support layer on the backside surface of the thinned wafer.

BRIEF DESCRIPTION OF THE DRAWINGS

These and other objects, features and advantages of the present invention will be readily understood with reference to the following detailed description thereof provided in conjunction with the accompanying drawings, wherein the same reference numerals are used designate identical and/or corresponding structural elements and features, and, in which.

These drawings are provided for illustrative purposes only and are not drawn to scale. The spatial relationships and relative sizing of the elements illustrated in the various embodiments may have been reduced, expanded or rearranged to improve the clarity of the figure with respect to the corresponding description. The figures, therefore, should not be interpreted as accurately reflecting the relative sizing or positioning of the corresponding structural elements that could be encompassed by an actual device manufactured according to the exemplary embodiments of the invention.

DETAILED DESCRIPTION

The present invention will now be described more fully hereinafter with reference to the accompanying drawings, in which several exemplary embodiments of the invention are illustrated. This invention may, however, be embodied in many different forms and should not be construed as limited to the particular embodiments set forth herein. Rather, these embodiments are provided so that this disclosure will be thorough and complete, and will fully convey the scope of the invention to those skilled in the art.

In the description, well-known structures and processes have not been described or illustrated in detail to avoid obscuring the present invention. It will be appreciated that for simplicity and clarity of illustration, some elements illustrated in the figures have not necessarily been drawn to scale. For example, the dimensions of some of the elements have been exaggerated or reduced relative to other elements for clarity.

Figure 1:
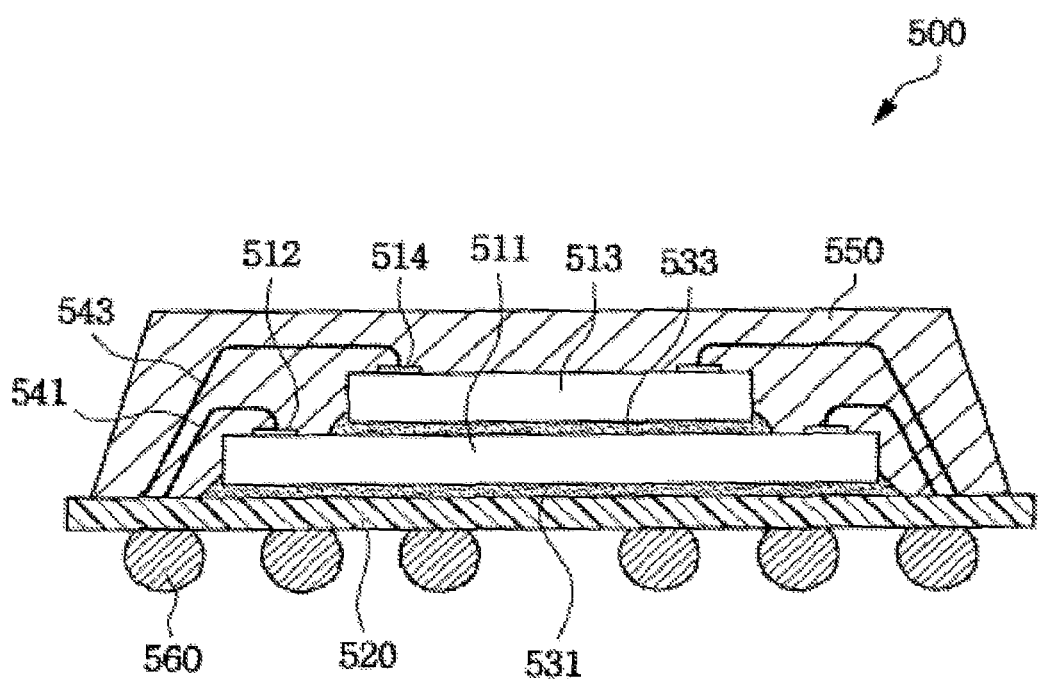
FIG. 1 is a cross-sectional view illustrating a conventional chip stack package manufactured at a chip level.
Figure 2:
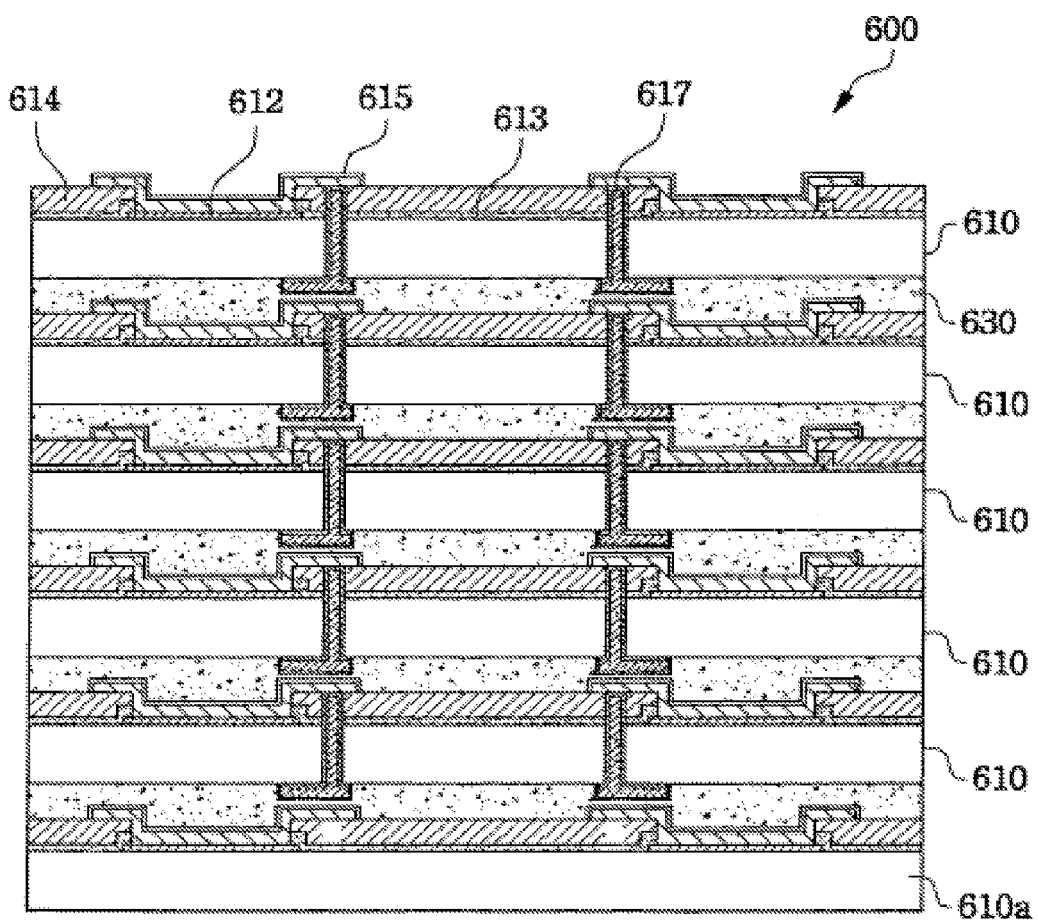
FIG. 2 is a cross-sectional view illustrating a conventional chip stack package manufactured at a wafer level.
Figure 3:
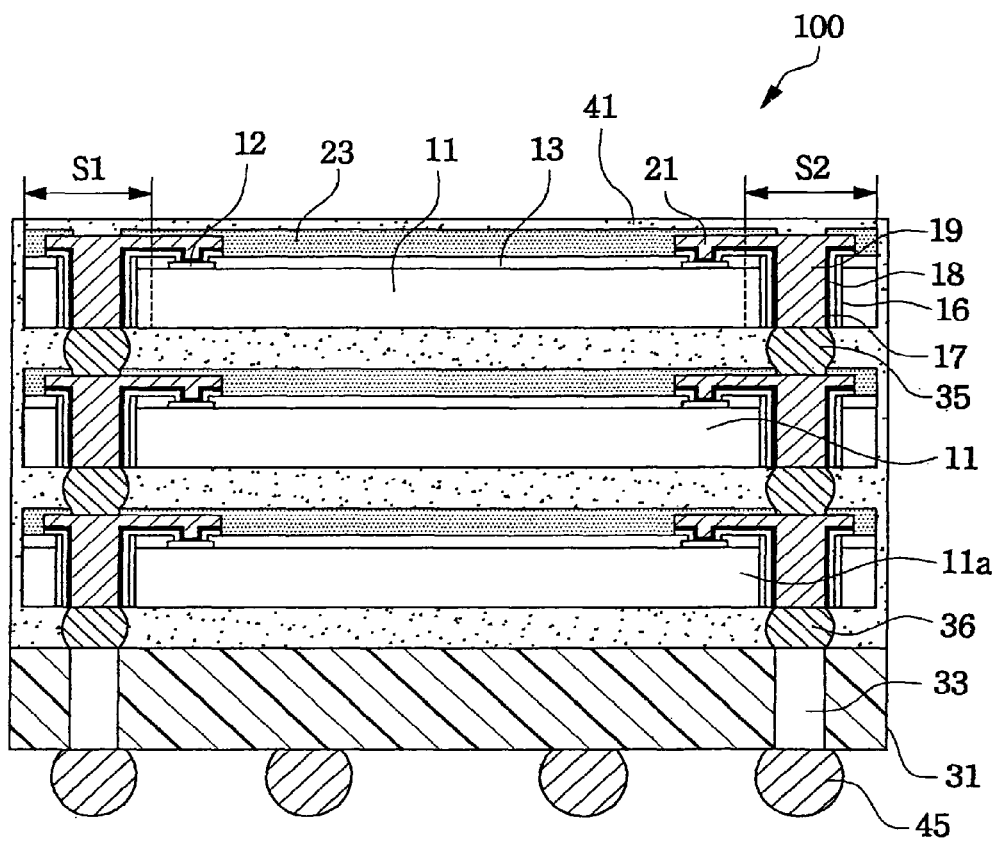
FIG. 3 is a cross-sectional view illustrating a chip stack package in accordance with one embodiment of the present invention.

As illustrated in FIG. 3 a chip stack package 100 according to an exemplary embodiment of the present invention includes two or more semiconductor chips 11, 11a stacked on a common substrate 31. Each chip 11, 11a includes, at its peripheral regions, parts of scribe lanes S1 and S2 that remain after each of the wafers from which the chips are separated is sawed along the scribe lanes. Connection vias 19 are formed in the remaining part of each scribe lane S1 and S2, for connecting the upper and lower surfaces of the chip 11, 11a. In order to improve the electrical properties, each of the connection vias 19 is preferably surrounded by a layer of a barrier metal 17 and an insulating layer 16. Each of the connection vias 19 may also be connected to one or more corresponding chip pads 12 through a rerouting line 21.

To establish a stack and electrical interconnection between adjacent chips 11, 11a, connection bumps 35 may be provided between upper and lower connection vias 19. Similarly, other connection bumps 36 may be provided between the lowermost chip 11a and the common substrate 31.

Figure 4:
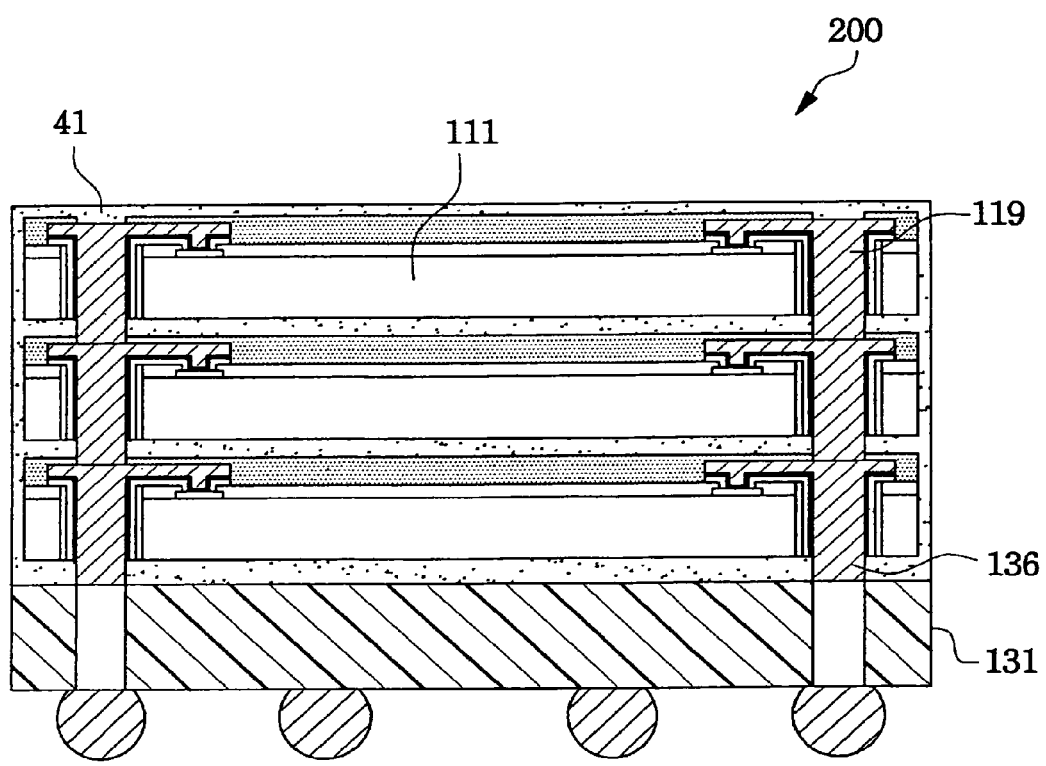
FIG. 4 is a cross-sectional view schematically showing a chip stack package in accordance with another embodiment of the present invention.

It is also possible to join adjacent chips directly and join the lowermost chip directly to the common substrate 31. As illustrated in FIG. 4, an alternative chip stack package 200 utilizes a direct joining between adjacent connection vias 119 of upper and lower chips 111, 111a and the lowermost chip 111a and the common substrate 131. Utilizing a direct joining technique may afford a reduction in the overall stack height of the resulting device.

Again referencing FIG. 3, the electrical interconnection between the stacked chips 11, the lowermost chip 11a and the substrate 31 is established through the connection vias 19 and the connection bumps 35, 36. Further, the common substrate 31 provides an electrical path, e.g. through vias 33, between the connection bumps 36 joined to the connection vias 19 of the lowermost chip 11a and connection terminals 45 disposed on the common substrate opposite the chips. Preferably, the connection bumps 36 are micro metal bumps having a diameter of about 20-60 μm, whereas the connection terminals 45 are preferably solder balls having a diameter of about 120 μm.

The common substrate 31 may be a wafer substrate obtained from a test wafer or otherwise provided with test device structures. During the manufacturing process, the chips 11, 11a may be mounted on the test wafer and subjected to both functional and parametric testing. Those chips that pass the defined testing protocol may then be provided as "known-good dies" or "known-good chips" for inclusion in the chip stack package 100. The common substrate 31 may also comprise conventional printed circuit boards (PCB) or tape wiring boards. Further, one or more interposers or buffer layers may be incorporated into the chip stack 100 between adjacent chips 11, 11a and/or the common substrate.

A chip stack package 100 may incorporate substantially identically sized semiconductor chips, e.g., using identical memory chips to increase memory density, but may also be configured for incorporating two or more chip sizes (not shown) if desired. In those instances in which the chip sizings are sufficiently different to prevent vertical alignment of the connection vias 19, additional rerouting lines may be utilized to achieve the desired electrical connections.

FIGS. 5-14 provide a sequence of cross-sectional views illustrating an exemplary process for manufacturing chip stack packages in accordance with an exemplary embodiment of the present invention. From the following description of the process, the structure of the above-discussed chip stack package will also be clear.

Figure 5:
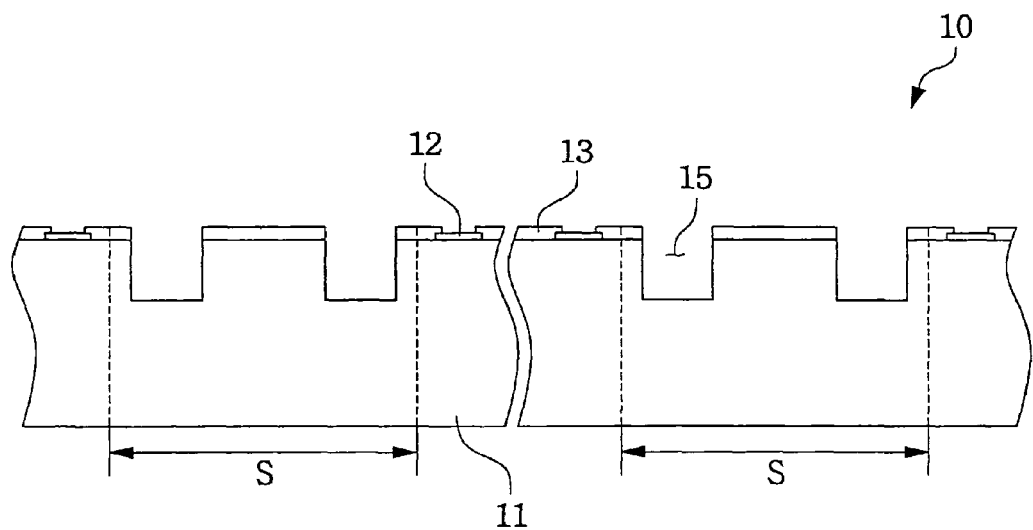
FIGS. 5 to 14 are cross-sectional views illustrating various steps according to an exemplary process for manufacturing chip stack packages in accordance an exemplary embodiment of the present invention.

As illustrated in FIG. 5, a wafer 10 is processed using a conventional or non-conventional semiconductor fabrication process to form a plurality of individual semiconductor chips 11 on a front side surface of the wafer and typically has been subjected to at least preliminary electrical die sorting (EDS). The majority of the circuitry on each of the chips 11 will typically be covered with a passivation layer 13 that includes openings exposing a plurality of chip pads 12. Between adjacent chips 11, the wafer 10 also includes scribe lanes, scribe lines or kerfs, as indicated by a reference character 'S' in the drawing.

A plurality of via holes 15 are then formed in the scribe lane adjacent each of the chips 11 separated by the scribe lane, with the via holes 14 associated with each of the chips 11 being separated by a intermediate portion of the scribe lane S. Although the actually sizing may vary depending on the type of wafer 10, the type of device 11 and the manufacturing tolerance of the semiconductor manufacturing process utilized, the scribe lanes S may have a typical width of about 110-220 μm. The via holes 15 are preferably sized and positioned within the scribe lane S to allow the separation operation, typically a laser cutter or saw blade, to remove a central region, typically between about 20-40 μm, from the intermediate portion of the scribe line S without exposing any portion of the via holes.

The via holes 15 may be formed using any drilling or etching process capable of forming via holes having accurate placement, sizing and depth. Direct drilling techniques, specifically laser drilling techniques, are, however preferred for their relative simplicity in contrast to plasma etching processes. Plasma etching techniques, for example, require the formation of an etch mask, necessitating the formation of a pattern mask and a corresponding photolithography process for transferring the pattern mask to the wafer surface, complicating the manufacturing process, and may require other modification of the chip design. On the other hand, laser drilling requires no masking operation or complicated processing or modification of the existing chip design and may, therefore, be readily and simply incorporated into an existing wafer fabrication process. Laser drilling also provides the ability to modify the location, depth and sizing of the via holes without substantial difficulty.

Figure 6:
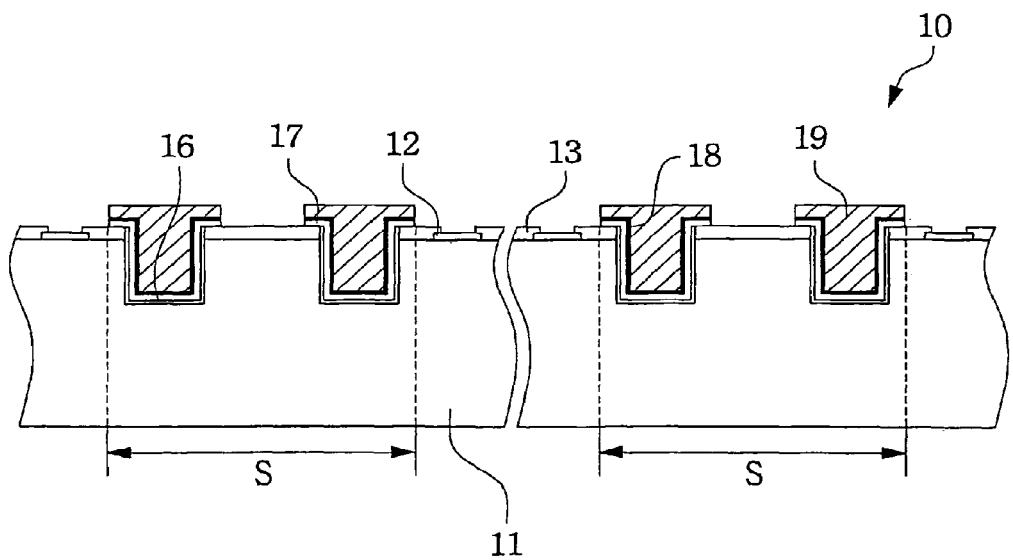
Figure 7:
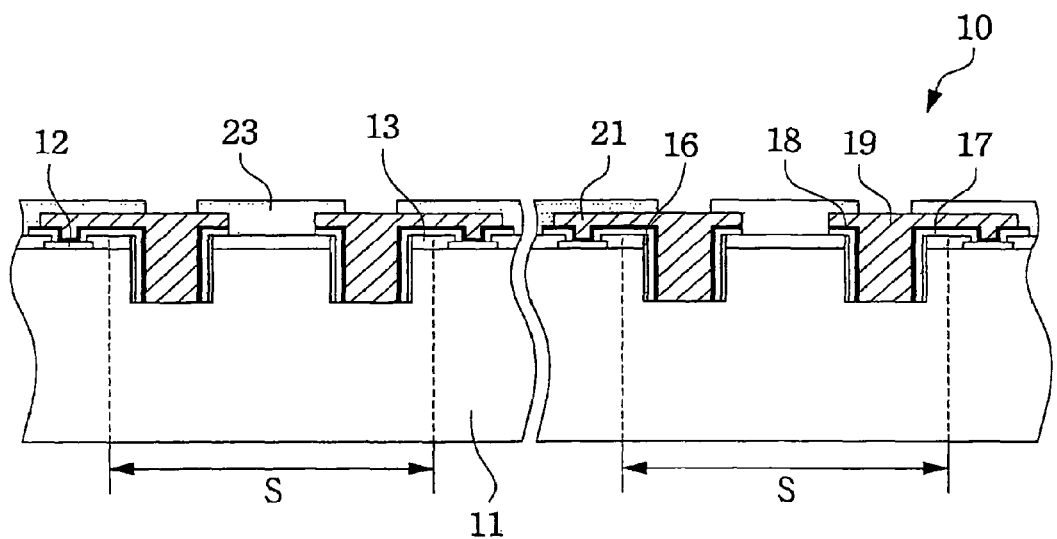

Next, as shown in FIG. 6, a plurality of connection vias 19 are formed by filling the via holes 15 with a conductive material, typically a metal after forming an insulating layer 16 on the inner wall of the via holes by using a sputtering, chemical vapor deposition or other layer forming technique to prevent electrical contact between the connection via and the surrounding bulk material of the wafer 10. A barrier metal layer 17 is then preferably formed on the insulating layer, typically by using a sputtering, evaporation or electroplating technique, to form a layer including titanium, titanium nitride, titanium-tungsten, platinum-silicon, aluminum or alloys thereof. A seed metal layer 18 is then preferably formed on the barrier metal layer 17, followed by the deposition or formation of the primary conductive material to fill the remainder of via hole 15 and complete the connection via 19. The primary conductive material may be deposited in the via hole 15 using an electroplating process to deposit a metal such as copper, gold or tungsten As illustrated in FIG. 7, the connection vias 19 may be connected to corresponding chip pads 12 by utilizing the rerouting technique, also referred to as the redistribution technique. Specifically, a metal layer may be deposited on the surface of wafer 10 to make contact with both a chip pad 12 and a corresponding connection via 19 and then patterned using a conventional technique, such as resist lift off or a metal etch to form rerouting lines 21. The rerouting lines 21 can be formed simultaneously during the formation of the connection vias 19. After forming the rerouting lines 21, a cover layer 23 may be formed to protect the rerouting lines 21 and portions of the connection vias 19 from the environment.

Figure 8:
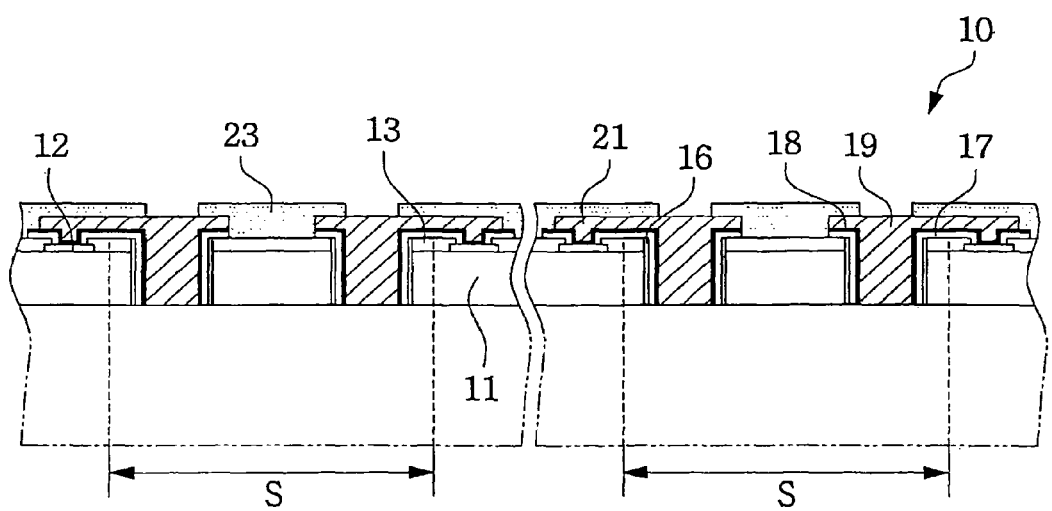

Next, as shown in FIG. 8, a portion of the wafer 10 thickness is removed from the backside of the wafer, typically by using a chemical-mechanical polishing (CMP) or a spin-wet etching technique. In accord with the exemplary embodiments of the present invention, the portion of the wafer 10 thickness removed will be sufficient to expose a lower portion of the connection vias 19. The spin-wet etching technique in particular has been found capable of achieving wafer 10 thicknesses of 50 μm or less without inflicting undue mechanical damage to the wafer 10.

Figure 9:
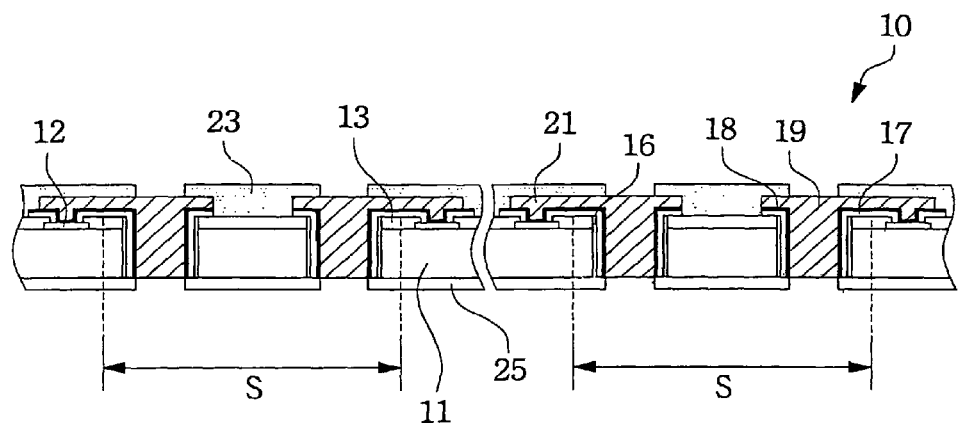

As illustrated in FIG. 9, after thinning the wafer 10, an optional support layer 25 including openings for exposing the lower surfaces of the connection vias 19 may be formed on the backside of the wafer using an insulating material or materials. When present, the support layer 25 is preferably selected to improve the strength and/or handling characteristics of the wafer 10 and also to reduce the likelihood that the thinned wafer will warp. The support layer pattern 25 may be temporary or permanent, with adhesive tapes and polyimide films being useful as temporary support layer patterns.

Figure 10:
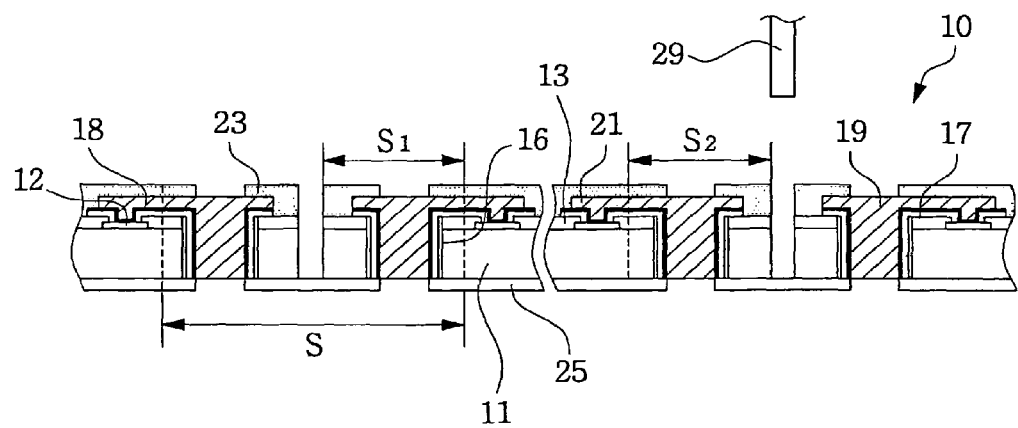

Next, as illustrated in FIG. 10, the wafer 10 is separated into its individual chips by cutting or sawing through a central region of the scribe lanes S of the thinned wafer using a cutting implement 29. The sawing operation is conducted so as not to damage or expose the connection vias 19 disposed in the opposed peripheral regions S1 and S2 of each scribe lane S. Thus, after the sawing operation is completed, each of the separated chips 11 will include, along its periphery, a plurality of connection vias 19 in the remaining peripheral region S1, S2 of the scribe lane S. The sawing operation is preferably controlled to limit or avoid removal or the support layer 25, allowing the support layer to maintain, at least temporarily, the relative orientation of the separated chips 11. Although the sawing operation may utilize a range of cutting or dicing implements 29, laser cutters are preferred for reducing damage to the wafer 10, such as chipping or cracking, and for reducing the width of the material removed from the scribe lanes S.

Figure 11:
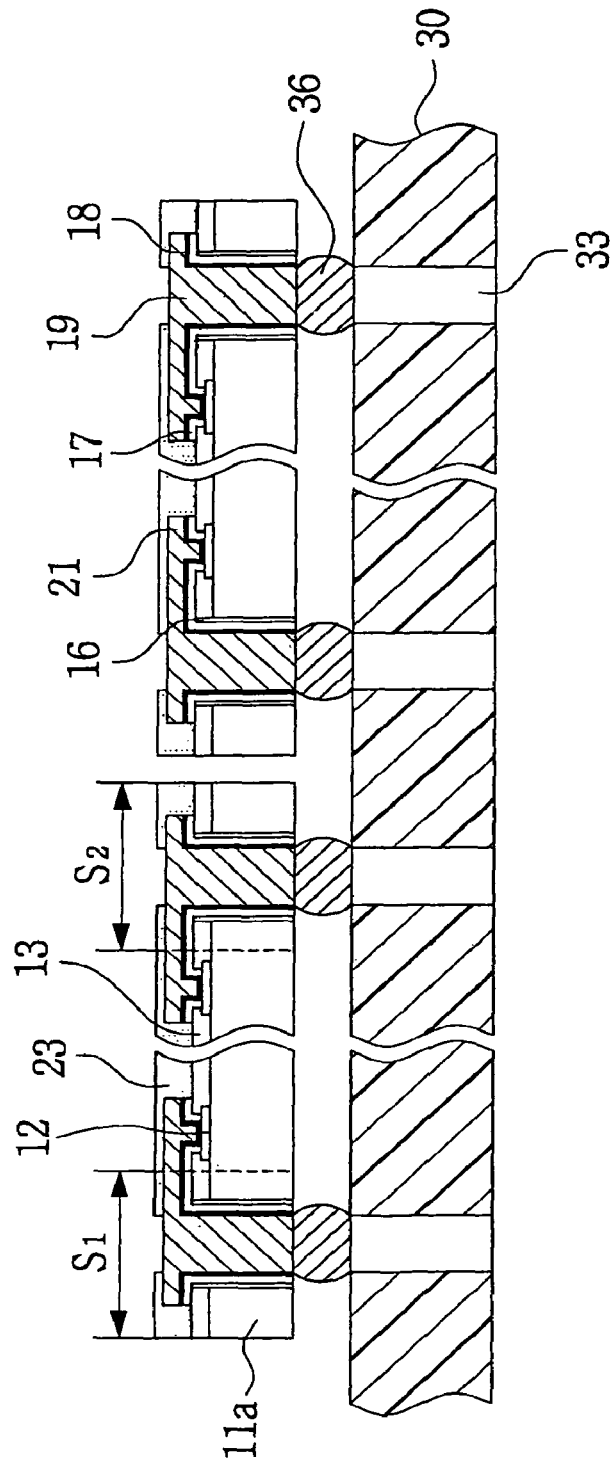

Next, as illustrated in FIG. 11, the separated chips 11a, which will act as the lowermost chips in a chip stack package, may be removed from the support layer 25 and attached to a test wafer 30. The test wafer 30 is, in turn, electrically coupled to external testers (not shown) and that are used to apply desired electrical and/or functional tests to the chips 11a. Although, as illustrated in FIG. 11, connection bumps 36 are utilized to physically attach and electrically connect the chips 11a to the test wafer 30, as illustrated in FIG. 4, direct connection between the chips and the test wafer may also be utilized. When connection bumps 36 are utilized, they may be arranged on the test wafer 30 at positions, sometimes referred to as ball pads or ball lands, corresponding to the connection vias 19 in the chips 11a.

After the connection vias 19 are connected to the test wafer 30, typically by using a thermal process to reflow or otherwise establish an electrical and physical connection between the connection vias 19 and corresponding contacts on the test wafer, package-level testing may be performed by exercising the chips 11a with an external tester (not shown) and evaluating the performance of the chips. Any of the chips 11a that fail the testing may be removed from the test wafer 30 and replaced with another chip, that will then be subjected to the testing procedure.

Figure 12:
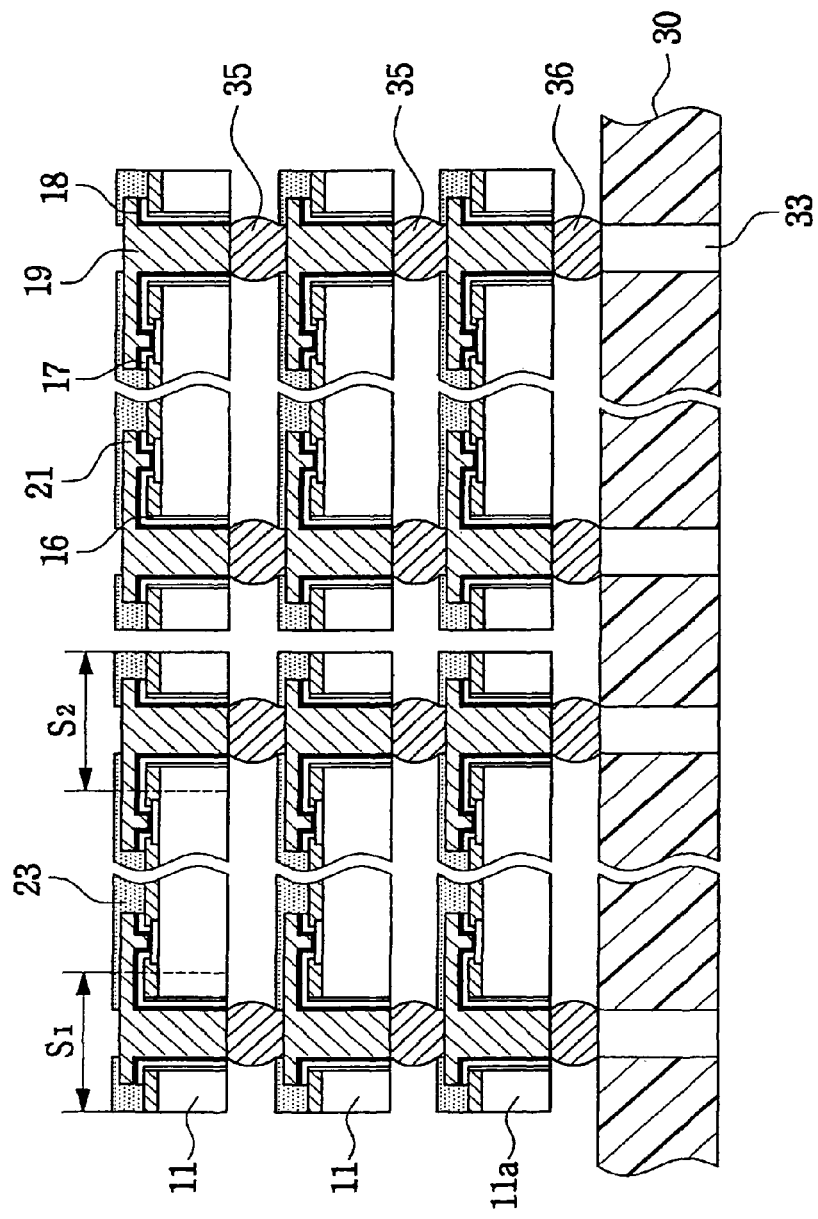

After the functioning of each of the lowermost chips 11a provided on the test wafer has been verified, the first layer of overlaying chips 11, i.e., second layer chips, are provided on the lowermost chips, as shown in FIG. 12. Connection bumps 35 may be formed or provided on the upper portions of the connection vias 19 of the lowermost chips 11a for attaching the second layer chips 11. The connection vias 19 of the second layer chips 11 may then be thermally joined to the connection bumps 35 on the lowermost chips.

Once the second layer chips 11 have been attached to the lowermost chips 11a, the second layer chips 11 may be subjected to functional and/or parametric testing. As with the lowermost chips 11a, those second layer chips 11 that fail the testing may be replaced with another chip that is then tested until all the second layer chips are passing the test procedure. Again, as illustrated in FIG. 4, the second and other subsequent layers of chips 11 may, in the alternative, be attached directly to the underlying chips 11a, 11 without the use of connection bumps.

This basic chip-stacking process may be repeated for each subsequent layer of chips 11. By ensuring that all of the chips 11 arranged in a single layer pass the tests before the next layer of chips 11 are applied, this stacking process provides chip stacks of known-good dies for use in chip stack packages.

As discussed above, failing chips 11, 11a are removed and replaced with another chip during each chip-stacking step. In order to remove the failing chips 11, 11a, a sufficient quantity of heat should be applied to melt the connection bumps that support the failing chips and allow such chips to be removed from the layer without altering the connection and configuration of adjacent and/or underlying chips. Such a result may be achieved by selecting materials for use in the connection bumps 35, 36 that have successively lower melting points for each successive layer of chips 11 applied to the test wafer 30. In this way, chips 11 included in the most recently layer applied layer can be removed without affecting the known-good dies in the underlying layer(s).

The size of the conductive bumps 35, 36 should be selected to generally correspond to the sizing of the connection vias 19 and may exhibit typical sizing of about 20-60 μm. The connection bumps 35, 36 may be formed using any conventional technique, such as ball injection or screen printing, that can achieve the desired sizing and placement accuracy.

Figure 13:
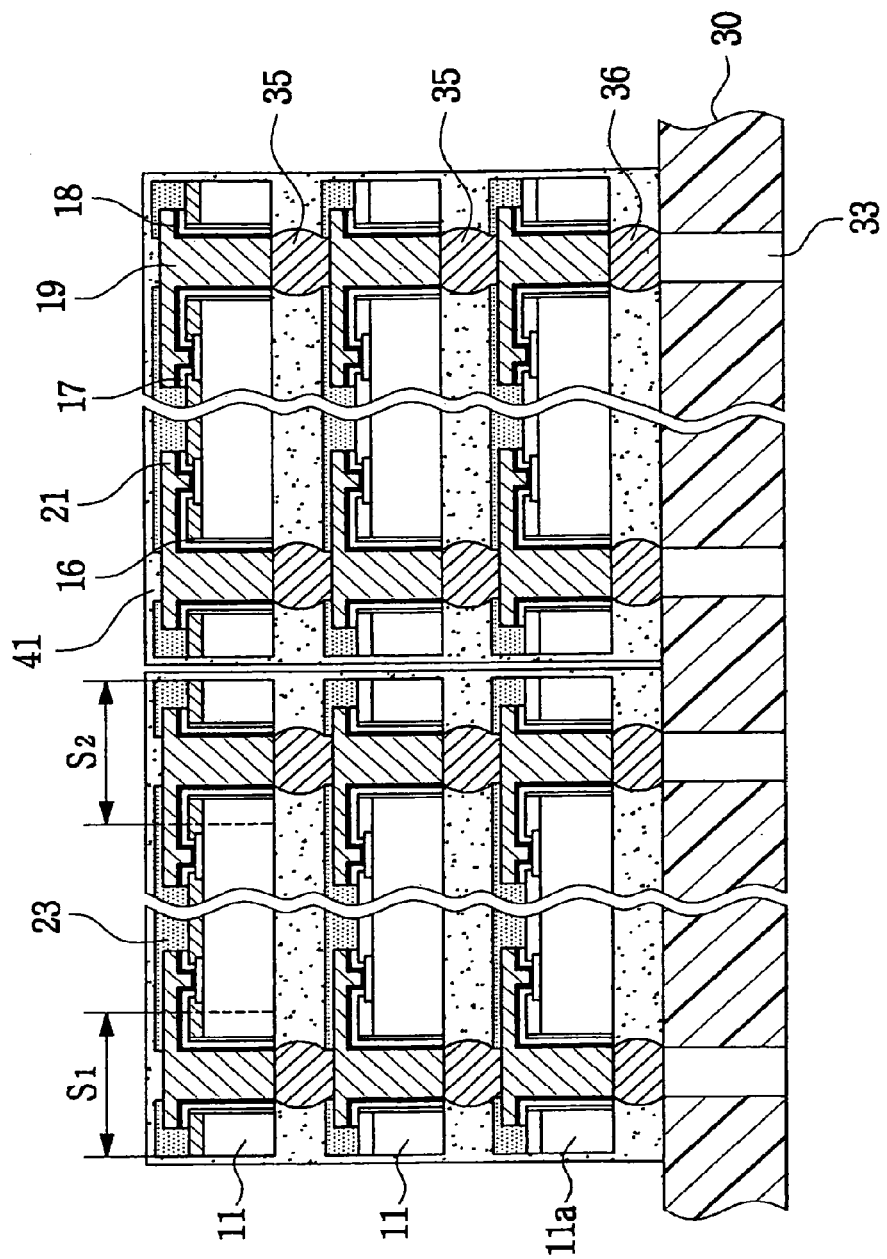

Next, as illustrated in FIG. 13, the stacked and tested chips 11a, 11 and a portion of the test wafer 30 may be encapsulated with a resin encapsulant 41 at a wafer level. Because this encapsulating process is performed in one operation on the test wafer 30, it may provide a reduction in the process time as compared with chip-level encapsulation of a corresponding chip stack structure. Depending on the spacing between adjacent chips 11a, 11 in the same level of the chip stack structure, the resin encapsulant may completely fill the space between adjacent chip stack structures (not shown) or a mold may be utilized to isolate the chip stack structures during the encapsulation process and leave an open space between adjacent chip stack structures.

Figure 14:
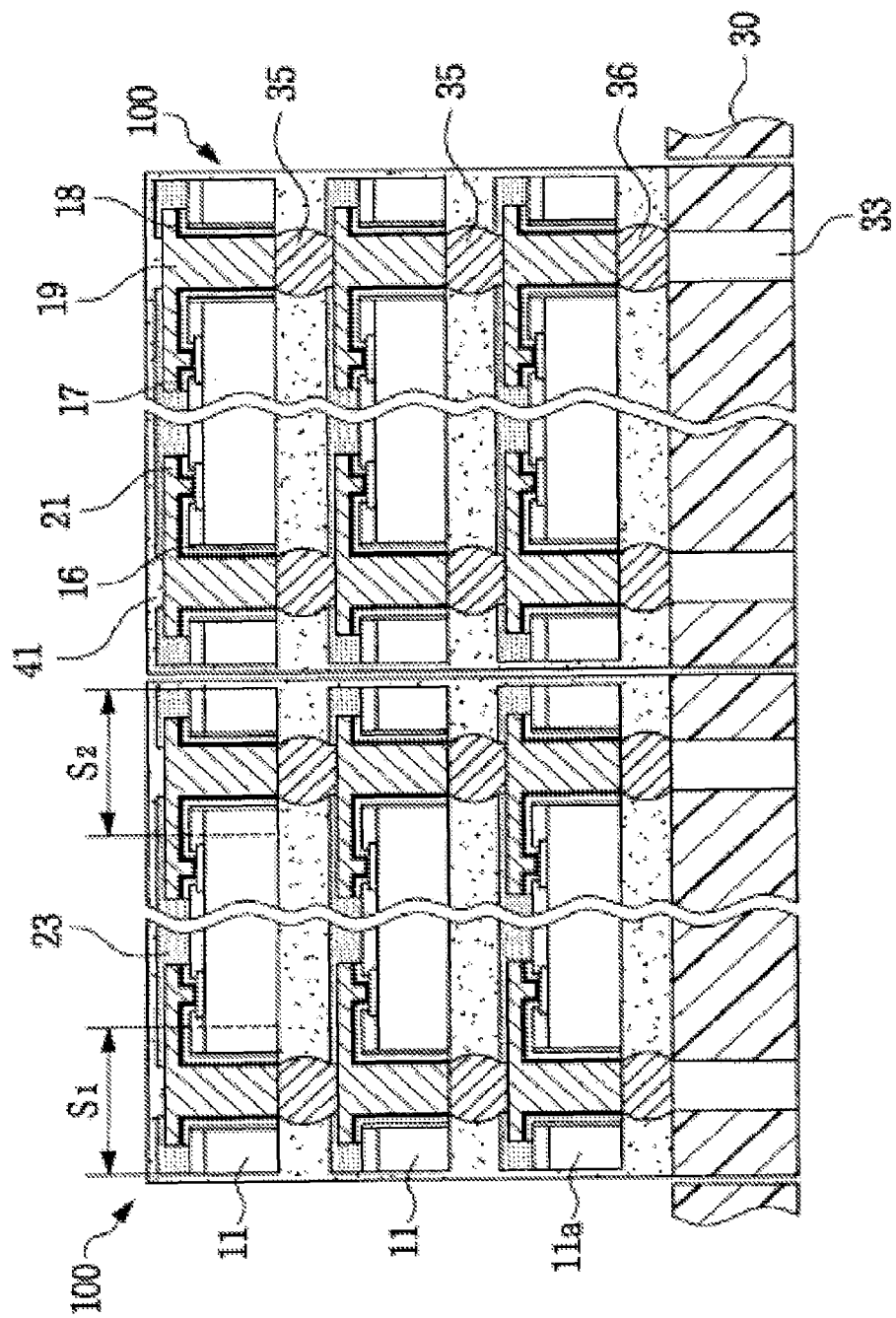

Next, as illustrated in FIG. 14, the multi-layer structure may be sawed by sawing through the encapsulating material 41 between the stacks of chips 11a, 11 (if present) and/or through the test wafer 30, to separate the individual chip stack packages 100 from each other. Then, as illustrated in FIG. 3, solder balls 45 may be formed on or applied to the lower surface of vias 33 on the lower surface of the test wafer 30, which corresponds to the common substrate 31 of FIG. 3, to provide external connections for mounting and electrically connecting the chip stack package on a PCB or other substrate.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A chip stack package comprising:
    a package substrate including:
        a first surface, the first surface including at least a first terminal; and
        a second surface, the second surface including at least a second terminal, the second terminal being in electrical contact with the first terminal,
        wherein the second terminal is an external terminal of the package; and
    a first chip stacked on the package substrate, the first chip being a lowermost chip of the chip stack package, the first chip including:
        a first surface;
        a second surface;
        at least a first chip pad on the first surface of the first chip;
        at least a first connection via formed through a portion of the first chip and separate from the first chip pad, the first connection via having an upper surface and a lower surface; and at least a first rerouting line connecting the first chip pad and the first connection via, wherein the package substrate is a wafer substrate having a size bigger than a size of the first chip.

2. A chip stack package according to claim 1, wherein the first terminal is a connection bump directly connected to the lower surface of the first connection via.

3. A chip stack package according to claim 1, wherein the second surface of the chip faces the first surface of the package substrate, and the first terminal is a bump arranged between the second surface of the chip and the first surface of the package substrate.

4. A chip stack package according to claim 1, further comprising:
a second chip stacked on the first chip, the second chip including:
a backside surface;
an active surface;
a second chip pad on the active surface;
a second connection via formed through a portion of the second chip separate from the second chip pad, the second connection via having an upper surface and a lower surface; and
a second rerouting line connecting the second chip pad to the second connection via,
wherein the second connection via is electrically connected to the first connection via.

5. A chip stack package according to claim 4, further comprising:
a third terminal, the third terminal being arranged between the lower surface of the second connection via and the upper surface of the first connection via.

6. A chip stack package according to claim 5, wherein the third terminal is a bump directly connected to the lower surface of the second connection via and the upper surface of the first connection via.

7. A chip stack package according to claim 5, wherein the first and third terminals are micro metal bumps.

8. A chip stack package according to claim 4, wherein the first and second chips are memory chips and have substantially identical dimensions.

9. A chip stack package according to claim 4, wherein the lower surface of the second connection via is directly connected to the upper surface of the first connection via.

10. A chip stack package according to claim 1, wherein the first terminal is connected to the second terminal through a package substrate via that passes through the package substrate.

11. The chip stack package according to claim 10, wherein the first terminal is a solder ball and the second terminal is a bump.

12. The chip stack package according to claim 10, wherein the package substrate via is vertically aligned with the first connection via.

13. The chip stack package according to claim 1, wherein:
the first connection via is laterally separate from the first chip pad;
the first rerouting line is disposed on the first surface of the first chip; and
the lower surface of the first connection via is vertically aligned with the first terminal.

14. The chip stack package according to claim 1, wherein the first rerouting line comprises a conductive material formed in a straight pattern on the first surface of the first chip.

15. A chip stack package comprising:
a first chip including:
a first backside surface;
a first active surface;
at least a first chip pad on the active surface;
at least a first connection via formed through a portion of the first chip and separate from the first chip pad, the first connection via having an upper surface and a lower surface, a lower portion of the first connection via extending beyond the first backside surface; and
at least a first rerouting line connecting the first chip pad and the first connection via;
a second chip stacked on the first chip, the second chip including:
a second backside surface;
an second active surface;
a second chip pad on the active surface;
a second connection via formed through a portion of the second chip separate from the second chip pad, the second connection via having an upper surface and a lower surface, a lower portion of the first connection via extending beyond the second backside surface; and
a second rerouting line connecting the second chip pad and the second connection via;
a wafer substrate mounting the first chip and the second chip, the wafer substrate being a package substrate of the chip stack package, and the first chip being a lowermost chip of the chip stack package,
wherein a size of the wafer substrate is bigger than a size of the first chip.

16. A chip stack package according to claim 15, wherein the first and second chips are memory chips and have substantially identical dimensions.

17. A chip stack package according to claim 15, wherein:
the first connection via is laterally separate from the first chip pad;
the first rerouting line is disposed on the first active surface of the first chip;
the second connection via is laterally separate from the second chip pad; and
the second rerouting line is disposed on the second active surface.

18. The chip stack package according to claim 17, wherein:
the second connection via is vertically aligned with the first connection via; and
the lower surface of the second connection via is directly connected to the upper surface of the first connection via.

19. The chip stack package according to claim 15, wherein the first rerouting line comprises a conductive material formed in a straight pattern on the first active surface of the first chip, and the second rerouting line comprises a conductive material formed in a straight pattern on the second active surface of the second chip.

* * * * *